(12) United States Patent
Choutov et al.

(10) Patent No.: US 6,479,394 B1
(45) Date of Patent: Nov. 12, 2002

(54) METHOD OF LOW-SELECTIVE ETCHING OF DISSIMILAR MATERIALS HAVING INTERFACES AT NON-PERPENDICULAR ANGLES TO THE ETCH PROPAGATION DIRECTION

(75) Inventors: Dmitri A. Choutov, San Jose, CA (US); Alexander Kalnitsky, Portland, OR (US); Geoffrey C. Stutzin, San Carlos, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/564,327

(22) Filed: May 3, 2000

(51) Int. Cl.⁷ .............................................. H01L 21/302
(52) U.S. Cl. ..................... 438/714; 438/697; 438/700; 438/719; 438/720; 438/724
(58) Field of Search ................................ 438/697, 700, 438/714, 719, 720, 724

(56) References Cited

U.S. PATENT DOCUMENTS

| | | | |
|---|---|---|---|
| 5,719,080 A | | 2/1998 | Kenney |
| 5,747,379 A | * | 5/1998 | Huang et al. ............... 438/586 |
| 5,874,345 A | * | 2/1999 | Coronel et al. ............. 438/427 |
| 5,960,297 A | * | 9/1999 | Saki ............................ 438/424 |
| 5,981,402 A | * | 11/1999 | Hsiao et al. ................ 438/756 |
| 6,074,954 A | * | 6/2000 | Lill et al. ................... 438/710 |
| 6,211,067 B1 | * | 4/2001 | Chen .......................... 438/633 |
| 6,303,413 B1 | * | 10/2001 | Kalnitsky et al. ........... 438/151 |

FOREIGN PATENT DOCUMENTS

| | | | |
|---|---|---|---|
| JP | 03-159236 | * | 7/1991 |
| JP | 05-343537 | * | 12/1993 |
| JP | 07-297280 | * | 11/1995 |
| JP | 02-023630 | * | 1/2000 |
| JP | 2000150642 | | 5/2000 |

OTHER PUBLICATIONS

A New Technique For Fabrication of OEIC's—The Etched Bac Planar Process—And Its Application To The Fabrication of Planar Embedded INP—INGAAS P–I–N–Photodiodes, by Shimizu et al., IEEE Photonics Technology Letters, IEEE Inc., New York, US, vol. 2, No. 10, Oct. 1, 1990, pp. 721–723.

* cited by examiner

*Primary Examiner*—George Goudreau
(74) *Attorney, Agent, or Firm*—Blakely, Sokoloff, Taylor & Zafman LLP

(57) ABSTRACT

A method of etching dissimilar materials having interfaces at non-perpendicular angles to the direction of the etch propagation that results in a low selectivity etch in order to achieve an improved planarized etched surface. The method includes the step of subjecting the dissimilar materials to a process gas mixture that includes a first gas that dominates the etching of a first material and a second gas that dominates the etching of a second material. The flow rates for the first and second materials are selected, along with other parameters of the plasma etch apparatus, to substantially equalize the etching rates for the two materials. This method is particularly useful to achieve a low-selective etching of materials having interfaces that are at a non-perpendicular angle with respect to the etch propagation.

14 Claims, 3 Drawing Sheets

Example of a non-selective etch

| Step | 1 | 2 | 3 | 4 | 5 | 6 | 7 | 8 |
|---|---|---|---|---|---|---|---|---|
| | St | Barc | St | Nit ME | St | Nit EP | St | Si |
| Pressure (mTorr) | 10 | 10 | 25 | 25 | 40 | 40 | 15 | 15 |
| He_Flow_Thres (sccm) | 30 | 30 | 30 | 30 | 30 | 30 | 30 | 30 |
| RF_Upper (Watt) | 0 | 250 | 0 | 550 | 0 | 550 | 0 | 700 |
| RF_Lower (Watt) | 0 | 40 | 0 | 15 | 0 | 10 | 0 | 90 |
| HBr (sccm) | 0 | 0 | 45 | 45 | 40 | 45 | 20 | 40 |
| CF$_4$ (sccm) | 100 | 100 | 90 | 90 | 160 | 160 | 100 | 80 |
| CHF$_3$ (sccm) | 0 | 0 | 0 | 0 | 0 | 0 | 0 | 0 |
| Gas-09 (Torr) | 6 | 6 | 6 | 6 | 6 | 6 | 6 | 6 |
| Completion | Stabl | EndPt | Stabl | Time | Stabl | EndPt | Stabl | Time |
| Time (seconds) | 10 | 30 | 20 | 70 | 10 | 40 | 10 | 150 |

LAM9400 non-selective etch process.

FIG. 4

| Step number, name | 1, Stab | 2, Nit | 3, Nit OE | 4, Stab | 5, Si | 6, Stab | 7, R |
|---|---|---|---|---|---|---|---|
| Step end control | By Time | Endpoint | 20% of 1 step | 315 | By Time | By Time | 15 |
| Maximum step time (seconds) | 10 | 100 | 30 | 315 | 158 | 10 | 15 |
| Endpoint Selection | No endpoint | Ext endpoint | No endpoint | No endpoint | No endpoint | No endpoint | No endpoint |
| RF Power (Watts) | 0 | 650 | 650 | 0 | 650 | 0 | 500 |
| Pressure (mTorr) | 65 | 65 | 65 | 100 | 100 | 80 | 80 |
| Magnet Field (Gauss) | 0.0 | 0.0 | 0.0 | 30 | 30 | 30 | 30 |
| Helium Pressure (Torr) | 4 | 4 | 4 | 4 | 4 | 4 | 4 |
| Gas Names and Flows (sccm) | CF$_4$ 92 | CF$_4$ 92 | CF$_4$ 92 | HBr 15 | HBr 15 | HBr 60 | HBr 60 |
| | HBr 10 | HBr 10 | HBr 10 | CF$_4$ 85 | CF$_4$ 85 | Cl$_2$ 20 | NF$_3$ 3 |
| | | | | | | He-O$_2$ 15 | He-O$_2$ 15 |

AMAT MXP non-selective etch process.

FIG. 5

METHOD OF LOW-SELECTIVE ETCHING OF DISSIMILAR MATERIALS HAVING INTERFACES AT NON-PERPENDICULAR ANGLES TO THE ETCH PROPAGATION DIRECTION

FIELD OF THE INVENTION

This invention relates generally to semiconductor processing, and in particular, to a method of low-selective etching materials having interfaces at non-perpendicular angles to the direction of the etch propagation.

BACKGROUND OF THE INVENTION

Planarization of thin film layers in a semiconductor device and/or integrated circuit is an important aspect of semiconductor processing. Top planar surfaces are desirable for many reasons. First, subsequent formation of devices and/or structures above a surface is generally easier if the surface is planarized, as oppose to having a non-planarized topology. Second, from an operational point of view, certain devices' performance and operation improve if certain features of the devices are planarized. Third, packaging of devices and/or integrated circuits typically require a final top surface that is substantially planarized. There are other reasons for planarizing of thin film layers in semiconductor devices and/or integrated circuits.

When semiconductor processing materials are vertically stacked on top of each other in layers, the interfaces of the layers are generally horizontal. The etching of vertical stacked layers typically does not typically result an irregular surface topology since the layers are generally etched one at a time. When two or more dissimilar semiconductor processing materials are arranged in a manner that their interfaces are at non-perpendicular angles to the direction of the etch propagation, it may be difficult to achieve a substantially planarized surface after etching. This is particularly true if the dissimilar materials have substantially different etching rates.

The reason for this is that when dissimilar materials are arranged so that their interfaces are at non-perpendicular angles with respect to the etch propagation direction, the dissimilar materials are being etched at the same time. If their etching rates are different, one material will etch faster than the other material. As a result, a non-planarized topology forms since the material having the higher etching rate will have etched more than the other, and thus, would have a top surface lower than the other material.

FIG. 1 illustrates a sectional view of an exemplary semiconductor structure 100 undergoing a selective etching process. The semiconductor structure 100 may comprise a mask 102 and several dissimilar materials 104, 106 and 108. These materials may include, for example, a mono-crystalline silicon for material 104, a thermal silicon oxide for material 106, and a poly-crystalline or a silicon dioxide formed by thermal oxidation 108. Based on a selective etching process, these materials 104, 106 and 108 have different etching rates ER1, ER2 and ER3, respectively.

Assume for this illustrative example that the etching rate ER3 for the poly-crystalline or a silicon dioxide 108 is greater than the etching rate ER1 for the mono-crystalline material 104, and whose etching rate ER1 is greater than the etching rate ER2 of the thermal silicon oxide 106. After the semiconductor structure 100 is subjected to the exemplary selective etching process, a non-planarized top surfaces of the etched materials results as illustrated in FIG. 1. That is, because of the higher etching rate ER3 of the thermal oxide 108, it has a top surface that is lower than the top surface of the mono-crystalline silicon 104 which has a lower etching rate ER1. Similarly, because the etching rate ER1 of the mono-crystalline silicon 104 is greater than the etching rate ER2 of the thermal oxide 106, the silicon 104 has a top surface that is lower than the top surface of the thermal oxide 106. As a result, the semiconductor structure 100 has an irregular topology, which may be undesirable.

Thus, there is a need for a method of etching dissimilar materials having interfaces at non-perpendicular angles to the direction of the etch propagation that results in a low selectivity etch in order to achieve an improved planarized etched surface.

SUMMARY OF THE INVENTION

An aspect of the invention includes a method of low-selectively etching dissimilar materials having interfaces at non-perpendicular angles to the direction of the etch propagation to achieve an improved planarized etched surface. In general, the method comprises introducing a particular process gas mixture (primary factor) along with a particular process setting (secondary factor) so that the respective etching rates of the dissimilar materials are substantially the same, i.e. a substantially low-selective etching process. The etching method of the invention is particularly appropriate for etching by a plasma etch apparatus.

In a plasma etch, a primary factor affecting the etch rate of a particular material is the process gas composition. For example, hydrogen bromide (HBr) and chlorine ($CL_2$) gasses typically define the etching rate of mono- and poly-crystalline silicon, whereas tri-fluoro methane ($CHF_3$) and di-fluoro methane ($CH_2F_2$) typically reduces the etching rates of mono- and poly-crystalline silicon. Also, for example, $CF_4$ typically defines the etching rates for oxides and nitrides, whereas oxygen ($O_2$) typically reduces the etching rates of oxides and nitrides. By properly mixing of process gases, a substantially low-selective etching of dissimilar materials can be achieved.

Besides the gas composition mixture as being a primary factor in determining the etching rates for various semiconductor process materials, there are secondary factors that also affect the etching rates of these materials. For instance, the plasma power setting, the process pressure, the helium (He) pressure on the backside of the wafer, and the wafer temperature are some examples of secondary factors that can be adjusted to change the etching rate of one or more materials. Although not a primary factor in determining the etching rates of semiconductor process materials, these secondary factors can be used to "fine tune" the method of etching dissimilar materials to achieve a substantially planarized etched surface.

BRIEF DESCRIPTION OF THE DRAWINGS

FIG. 4 illustrates a table depicting an exemplary list of the steps and parameters for a LAM9400 model plasma etch apparatus used to achieve a low selectivity etch of various materials to form a shallow trench in accordance with the invention; and FIG. 5 illustrates a table depicting an exemplary list of the steps and parameters for a AMAT MXP model plasma etch apparatus used to achieve a low selectivity etch of various materials to form a shallow trench in accordance with the invention.

DETAILED DESCRIPTION OF THE INVENTION

An aspect of the invention includes a method of etching dissimilar materials having interfaces at non-perpendicular angles to the direction of the etch propagation that results in a low selectivity etch in order to achieve an improved planarized etched surface. The etching method of the invention is particularly appropriate for etching by a plasma etch apparatus. In a plasma etch, a primary factor affecting the etch rate of a particular material is the process gas composition. For example, hydrogen bromide (HBr) and chlorine ($CL_2$) gasses typically define the etching rate of mono- and poly-crystalline silicon, whereas tri-fluoro methane ($CHF_3$) and di-fluoro methane ($CH_2F_2$) typically reduces the etching rates of mono- and poly-crystalline silicon. Also, for example, $CF_4$ gas typically defines the etching rates for oxides and nitrides, whereas oxygen ($O_2$) typically reduces the etching rates of oxides and nitrides.

Besides the gas composition mixture as being a primary factor in determining the etching rates for various semiconductor process materials, there are secondary factors that also affect the etching rates of these materials. For instance, the plasma power setting, the process pressure, the helium (He) pressure on the backside of the wafer, and the wafer temperature to name a few. Although not a primary factor in determining the etching rates of semiconductor process materials, these secondary factors can be used to "fine tune" the method of simultaneously etching dissimilar materials to achieve a substantially low selectivity etch to improve planarization of the etched surface.

Using the above principles, the method of achieving a substantially low-selectivity etching of dissimilar materials having interfaces at non-perpendicular angles to the direction of the etch propagation typically comprises introducing a particular process gas mixture (primary factor) along with establishing particular process settings (secondary factor) so that the respective etching rates of the dissimilar materials are substantially the same, i.e. a substantially low-selective etching process. A simplified example of the method is provided below, and a more detailed example of the method will be provided further in the disclosure. These are merely examples, and the scope of the invention shall not be limited to these examples, but should encompass the broad teachings of the invention.

Figure 2:
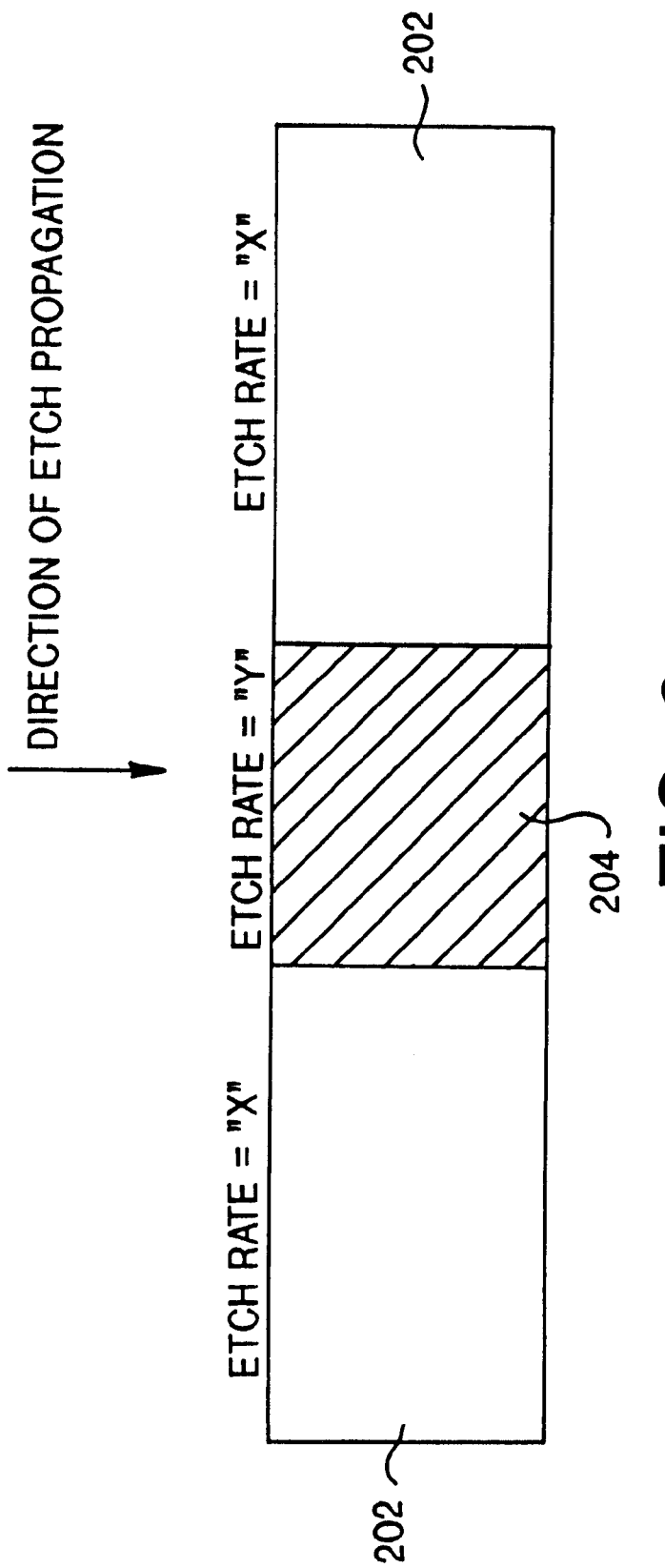
FIG. 2 illustrates a sectional view of two dissimilar semiconductor process materials having interfaces at a non-perpendicular angle with respect to the direction of the etch propagation.

FIG. 2 illustrates a sectional view of two dissimilar semiconductor process materials 202 and 204 having interfaces at a non-perpendicular angle with respect to the direction of the etch propagation, as indicated by the arrow. Although in this example, the interfaces of the materials 202 and 204 are substantially parallel to the direction of etch propagation, it shall be understood that the method of the invention covers other angles other than substantially perpendicular angles to the direction of etch propagation. In this example, material 202 consists of a mono-crystalline silicon and material 204 consists of an oxide.

In this example, assume that for a given process setting, the etch rate of the mono-crystalline silicon 202 using hydrogen bromide (HBr) gas as an etchant is "X", and the etch rate of the oxide 204 using methane $CF_4$ gas as an etchant is "Y." Thus, the process gas mixture for performing a substantially low-selective etching of materials 202 and 204 will comprise at least a mixture of hydrogen bromide (HBr) and $CF_4$, because these are gasses that dominate the etching of these respective materials. Also assume, for this example, that the etch rate "X" of the mono-crystalline silicon 202 is greater than the etch rate "Y" of the oxide 204. In this example, it may be desirable to introduce to the process gas mixture, an additional gas that would reduce the etch rate "X" of the mono-crystalline 202 so that it etches at substantially the same etch rate "Y" of the oxide 204. Such a gas may include tri-fluoro methane ($CHF_3$) or di-fluoro methane ($CH_2F_2$), which typically reduces the etching rates of mono- and poly-crystalline silicon. Thus, the process gas mixture in this example would include hydrogen bromide (HBr) and $CF_4$ and tri-fluoro methane ($CHF_3$) or di-fluoro methane ($CH_2F_2$).

This example illustrates the concept of the invention of arriving at a process gas mixture that achieves a substantially low selectivity etching of dissimilar materials having interfaces that are at non-perpendicular angles with respect to the direction of etch propagation. By including a specific mixture of etch promoting and suppressing gases, simultaneous and low-selectivity etching of dissimilar materials may be achieved. Additionally, the parameters of the plasma etching apparatus may be configured, in addition to providing a specific mixture of the process gas, in order to fine tune the process so that substantially the same etch rate can be achieved for the dissimilar materials. A more specific example of the method of the invention is described below.

Figure 1:
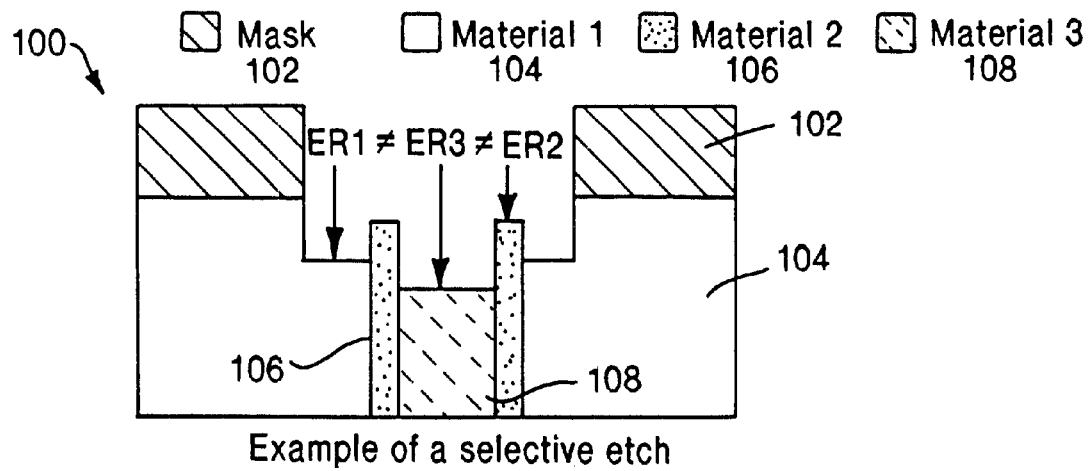
FIG. 1 illustrates a sectional view of an exemplary semiconductor structure having undergone a selective etching process.
Figure 3:
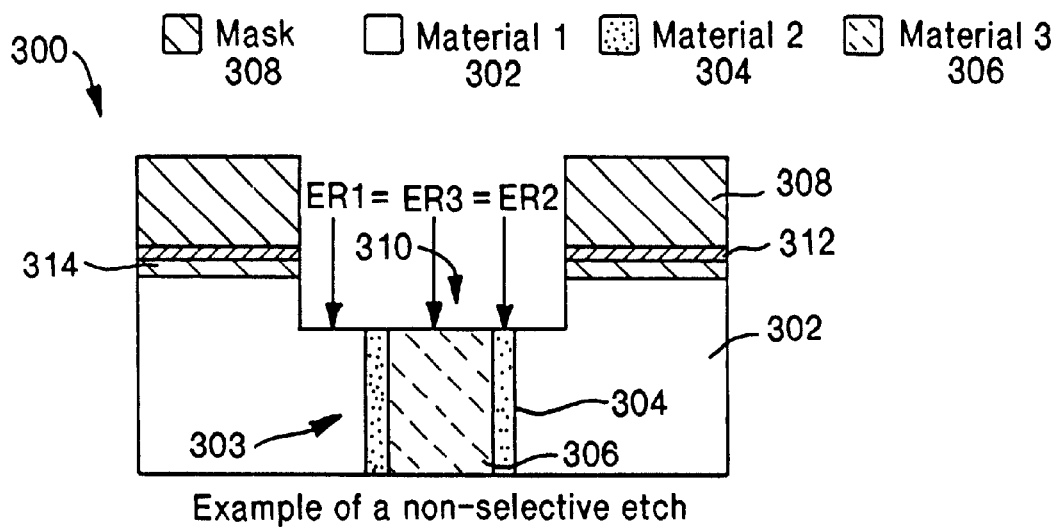
FIG. 3 illustrates a sectional view of an exemplary semiconductor structure having undergone a substantially low selective etching process in accordance with the invention.

FIG. 3 illustrates a sectional view of a portion of an exemplary silicon on insulator (SOI) wafer 300 in which a shallow and deep trench isolations has been formed in accordance with the method of the invention. The preferred method of forming the shallow and deep trench isolations is described in Patent Application entitled "Method of Forming a Shallow and Deep Trench Isolation (SDTI) Suitable for Silicon on Insulator (SOI) Substrates," filed concurrently herewith, and hereby incorporated by reference. The SOI wafer 300 comprises a mono-crystalline silicon layer 302 having a deep trench isolation 303 comprising a thermal silicon oxide 304 and a poly-crystalline silicon 306. The SOI wafer 300 further includes a photo resist mask layer 308, a Bottom Antireflective Coating (BARC) 312, and an active area nitride layer 314 with an opening that has been etched along with the mono-crystalline silicon layer 302, the thermal silicon oxide 304 and the poly-crystalline silicon 306 to form the shallow trench 310 with the substantially low selective etch in accordance with the invention.

FIG. 4 illustrates a table depicting an exemplary list of the steps and parameters for a LAM9400 model plasma etch apparatus manufactured by LAM Research Corporation used to achieve a low selectivity etch of various materials to form a shallow trench in accordance with the invention. In the preferred implementation of the method, there are eight (8) steps in the method of forming the shallow trench 310, as listed in the top horizontal entries of the table. The first seven (7) steps are preparation steps, including the etching of the Bottom Antireflective Coating (BARC) 312 and the active area nitride 314, performed prior to the low selectivity etch of the method of the invention, which is performed in step eight (8).

Step one (1) of the method of forming the shallow trench 310 is a stability step (St). Stability steps are typically performed each time the environment in the plasma etching chamber has changed to allow the environment to stabilize prior to initiation of the next step. In this case, the plasma etch environment is being changed from a "turn off" environment to an etching of a Bottom Antireflective Coating (BARC) environment as specified in step two (2).

In stability step one (1), the gas plasma pressure is set to 10 mTorr, the Helium Flow Threshold (i.e. maximum flow rate for the Helium gas on the backside of the wafer) abbreviated He_Flow_Thres is set to 30 sccm, the radio frequency (RF) power on the upper electrode abbreviated RF_Upper is set to zero (0) Watt, the RF power on the lower electrode abbreviated RF_Lower is set to zero (0) Watt, the flow rate for the hydrogen bromide (HBr) process gas is set to zero (0) sccm, the flow rate for the $CF_4$ process gas is set to 100 sccm, the flow rate for the tri-fluoro methane ($CHF_3$) process gas is set to zero (0) sccm, the pressure of the Helium gas on the backside of the wafer abbreviated as Gas-09 is set to six (6) Torr, the completion of the step is based on when the process environment stabilizes (abbreviated "Stabl"), and the maximum time for completion of the step is set to ten (10) seconds, which causes an alarm to sound if the process takes more than the maximum time.

Step two (2) of the method of forming the shallow trench 310 is a step of etching the Bottom Antireflective Coating (BARC) 312, which has been deposited over the active area nitride area 314. In this step, the gas plasma pressure is set to 10 mTorr, the Helium Flow Threshold is set to 30 sccm, the RF power on the upper electrode is set to 250 Watts, the RF power on the lower electrode is set to 40 Watts, the flow rate of the hydrogen bromide (HBr) process gas is set to zero (0) sccm, the flow rate of the $CF_4$ process gas is set to 100 sccm, the flow rate of the tri-fluoro methane ($CHF_3$) process gas is set to zero (0) sccm, the pressure of the Helium gas (Gas-09) on the backside of the wafer is set to six (6) Torr, the completion of the step is based on when an endpoint detection has occurred signifying that the Bottom Antireflective Coating (BARC) layer 312 has been substantially removed (abbreviated "Endpt"), and the maximum time for completion of the step is set to 30 seconds.

Step three (3) of the method of forming the shallow trench 310 is another stability step (St). In this case, the plasma etch environment is being changed from the etching of the Bottom Antireflective Coating (BARC) environment as specified in step two (2) to an etching of an active area nitride layer environment specified in step four (4). In step three (3), the gas plasma pressure is set to 25 mTorr, the Helium Flow Threshold is set to 30 sccm, the RF power on the upper electrode is set to zero (0) Watt, the RF power on the lower electrode is set to zero (0) Watt, the flow rate of the hydrogen bromide (HBr) process gas is set to 45 sccm, the flow rate of the $CF_4$ process gas is set to 90 sccm, the flow rate of the tri-fluoro methane ($CHF_3$) process gas is set to zero (0) sccm, the pressure of the Helium gas (Gas-09) on the backside of the wafer is set to six (6) Torr, the completion of the step is based on when the process environment stabilizes, and the maximum time for completion of the step is set to 20 seconds.

Step four (4) of the method of forming the shallow trench 310 is a step of etching the active area nitride layer 314 in the process of forming the shallow trench 310. In this step, the gas plasma pressure is set to 25 mTorr, the Helium Flow Threshold is set to 30 sccm, the RF power on the upper electrode is set to 550 Watts, the RF power on the lower electrode is set to 15 Watts, the flow rate of the hydrogen bromide (HBr) process gas is set to 45 sccm, the flow rate of the $CF_4$ process gas is set to 90 sccm, the flow rate of the tri-fluoro methane ($CHF_3$) process gas is set to zero (0) sccm, the pressure of the Helium gas (Gas-09) on the backside of the wafer is set to six (6) Torr, the completion of the step is based on a time of 70 seconds.

Step five (5) of the method of forming the shallow trench 310 is another stability step (St). In this case, the plasma etch environment is being changed from the etching of active area nitride layer environment as specified in step four (4) to the end-point etching of the active area nitride step as specified in step 6. In step five (5), the gas plasma pressure is set to 40 mTorr, the Helium Flow Threshold is set to 30 sccm, the RF power on the upper electrode is set to zero (0) Watt, the RF power on the lower electrode is set to zero (0) Watt, the flow rate of the hydrogen bromide (HBr) process gas is set to 40 sccm, the flow rate of the $CF_4$ process gas is set to 160 sccm, the flow rate of the tri-fluoro methane ($CHF_3$) process gas is set to zero (0) sccm, the pressure of the Helium gas (Gas-09) on the backside of the wafer is set to six (6) Torr, the completion of the step is based on when the process environment becomes substantially stable, and the maximum time for completion of the step is set to 10 seconds.

Step six (6) of the method of forming the shallow trench 310 is a step of etching the active area nitride layer until an endpoint has been detected, in the process of forming the shallow trench 310. In this step, the gas plasma pressure is set to 40 mTorr, the Helium Flow Threshold is set to 30 sccm, the RF power on the upper electrode is set to 550 Watts, the RF power on the lower electrode is set to 10 Watts, the flow rate of the hydrogen bromide (HBr) process gas is set to 45 sccm, the flow rate of the $CF_4$ process gas is set to 160 sccm, the flow rate of the tri-fluoro methane ($CHF_3$) process gas is set to zero (0) sccm, the pressure of the Helium gas (Gas-09) on the backside of the wafer is set to six (6) Torr, the completion of the step is based on an endpoint detection, and the maximum time for completion of the step is set to 40 seconds.

Step seven (7) of the method of forming the shallow trench 310 is another stability step (St). In this case, the plasma etch environment is being changed from the endpoint etching of active area nitride layer environment as specified in step six (6) to the substantially low selective etching of the mono-crystalline silicon layer 302, the thermal silicon oxide 304 and the poly-crystalline silicon 306 as specified in step eight (8). In step seven (7), the gas plasma pressure is set to 15 mTorr, the Helium Flow Threshold is set to 30 sccm, the RF power on the upper electrode is set to zero (0) Watt, the RF power on the lower electrode is set to zero (0) Watt, the flow rate of the hydrogen bromide (HBr) process gas is set to 20 sccm, the flow rate of the $CF_4$ process gas is set to 100 sccm, the flow rate of the tri-fluoro methane ($CHF_3$) process gas is set to zero (0) sccm, the pressure of the Helium gas (Gas-09) on the backside of the wafer is set to six (6) Torr, the completion of the step is based on when the process environment becomes substantially stable, and the maximum time for completion of the step is set to 10 seconds.

Step eight (8) of the method of forming the shallow trench 310 is the etching of the mono-crystalline silicon layer 302, the thermal silicon oxide 304 and the poly-crystalline silicon 306. This is performed with the substantially low selective etching method of the invention. The objective here is to etch the mono-crystalline silicon layer 302, the thermal silicon oxide 304 and the poly-crystalline silicon 306 such that their etch rates are substantially the same. Thus, as a result of the substantially low selective etch process of the invention, a substantially planarized bottom surface of the shallow trench 310 is formed.

The flow rates, among other parameters of the LAM9400, for the active process gases (i.e. hydrogen bromide (HBr), $CF_4$, and tri-fluoro methane ($CHF_3$)) are selected to achieve substantially the same etch rates for the mono-crystalline silicon layer 302, the thermal silicon oxide 304, and the poly-crystalline silicon 306. As previously discussed, hydrogen bromide (HBr) is the primary etchant for the mono- and poly-crystalline silicon 302 and 306, and $CF_4$ is the primary etchant for thermal silicon oxide 304. The tri-fluoro methane ($CHF_3$), in this case, acts to reduce the etching rates of the mono- and poly-crystalline silicon 302 and 306 to equalize them with the etching rate of the thermal oxide layer 304.

More specifically, in step eight (8), the gas plasma pressure is set to 15 mTorr, the Helium Flow Threshold is set to 30 sccm, the RF power on the upper electrode is set to 700 Watts, the RF power on the lower electrode is set to 90 Watts, the flow rate of the hydrogen bromide (HBr) process gas is set to 40 sccm, the flow rate of the methane $CF_4$ process gas is set to 80 sccm, the flow rate of the tri-fluoro methane ($CHF_3$) process gas is set to 50 sccm, the pressure of the Helium gas (Gas-09) on the backside of the wafer is set to six (6) Torr, the completion of the step is based on a time of 150 seconds. This completes the exemplary method of forming the shallow trench 310 using the LAM9400 plasma etching apparatus.

FIG. 5 illustrates a table depicting an exemplary list of the steps and parameters for an AMAT MXP model plasma etch apparatus manufactured by Applied Materials Corporation used to achieve a low selectivity etch of various materials to form a shallow trench in accordance with the invention. In the preferred implementation of the method, there are seven (7) steps in the method of forming the shallow trench 310, as listed in the top horizontal entries of the table. The first five (5) steps are preparation steps including the etching of the Bottom Antireflective Coating (BARC) 312 and the active area nitride 314, performed prior to the low selectivity etch of the method of the invention, which is performed in step five (5). Step seven (7) is provided to round off the bottom corners of the shallow trench 310, which is desirable to reduce stress and high electric field concentrations in these regions. This is not needed in the LAM9400 process described above, since rounded corners are inherently formed by that process.

Step one (1) of the method of forming the shallow trench 310 is a stability step (St). In this case, the plasma etch environment is being changed from a "turn off" environment to an etching of the Bottom Antireflective Coating (BARC) 312 and the active area nitride layer 314 environment as specified in step two (2). In stability step one (1), the completion of the step (designated as Step end control) is based a on time of 10 seconds. There is no endpoint detection in this step. The RF power is set to zero (0) Watt. The pressure of the process gas is set to 65 mTorr. The magnetic field is set to zero (0) Gauss. The Helium backside pressure on the wafer is set to 4000 mTorr. The flow rate for the $CF_4$ process gas is set to 92 sccm. And, the flow rate for the hydrogen bromide (HBr) process gas is set to 10 sccm.

Step two (2) of the method of forming the shallow trench 310 is a step of etching the Bottom Antireflective Coating (BARC) 312 and an active area nitride 314. In this step, the completion of the step is based on detecting an endpoint. The maximum time for the step is set to 100 seconds. There is an endpoint detection in this step. The RF power is set to 650 Watts. The pressure of the process gas is set to 65 mTorr. The magnetic field is set to zero (0) Gauss. The Helium backside pressure on the wafer is set to 4000 mTorr. The flow rate for the $CF_4$ process gas is set to 92 sccm. And, the flow rate for the hydrogen bromide (HBr) process gas is set to 10 sccm.

Step three (3) of the method of forming the shallow trench 310 is to etch about 20 percent beyond the detection of the endpoint of the active nitride layer 314 to insure that substantially all of the layer has been removed. In this step, the completion of the step is based on time, i.e. 20 percent of the time it took to the detection of the endpoint in step two (2), The maximum time for the step is set to 30 seconds. There is no endpoint detection in this step. The RF power is set to 650 Watts. The pressure of the process gas is set to 65 mTorr. The magnetic field is set to zero (0) Gauss. The Helium backside pressure on the wafer is set to 4000 mTorr. The flow rate for the $CF_4$ process gas is set to 92 sccm. The flow rate for the hydrogen bromide (HBr) is set to 10 sccm.

Step four (4) of the method of forming the shallow trench 310 is another stability step (St). In this case, the plasma etch environment is being changed from the environment used in etching the active area nitride layer 314 as specified in step three (3) to the environment used to etch the mono-crystalline silicon layer 302, the thermal silicon oxide 304 and the poly-crystalline silicon 306 as specified in step five (5). In this stability step, the completion of the step is based on a time of 315 seconds. There is no endpoint detection in this step. The RF power is set to zero (0) Watt. The pressure of the process gas is set to 100 mTorr. The magnetic field is set to 30 Gauss. The Helium backside pressure on the wafer is set to 4000 mTorr. The flow rate for the hydrogen bromide (HBr) process gas is set to 15 sccm. And, the flow rate for the $CF_4$ process gas is set to 85 sccm.

Step five (5) of the method of forming the shallow trench 310 is the etching of the mono-crystalline silicon layer 302, the thermal silicon oxide 304 and the poly-crystalline silicon 306. This is performed with the substantially low selective etching method of the invention. The objective here is to etch the mono-crystalline silicon layer 302, the thermal silicon oxide 304 and the poly-crystalline silicon 306 such that their etch rates are substantially the same. Thus, as a result of the substantially low selective etch process of the invention, a substantially planarized bottom surface of the shallow trench 310 is formed.

The flow rates, among other parameters of the AMAT MXP, for the active process gases (i.e. hydrogen bromide (HBr) and $CF_4$ are selected to achieve substantially the same etch rates for the mono-crystalline silicon layer 302, the thermal silicon oxide 304 and the poly-crystalline silicon 306. As previously discussed, hydrogen bromide (HBr) is the primary etchant for the mono- and poly-crystalline silicon 302 and 306 and $CF_4$ is the primary etchant for thermal silicon oxide 304. Note, that the process gas mixture does not have an etchant suppressant in this case. This is because it was determined that the etch rates for the mono-crystalline silicon layer 302, the thermal silicon oxide 304 and the poly-crystalline silicon 306 can be substantially equalized without an etch suppressant.

More specifically, in step five (5), the completion of the step is based on time, which in this case is set to 158 seconds. There is no endpoint detection in this step. The RF power is set to 650 Watts. The pressure of the process gas is set to 100 mTorr. The magnetic field is set to 30 Gauss. The Helium backside pressure on the wafer is set to 4000 mTorr. The flow rate for the hydrogen bromide (HBr) is set to 15 sccm. And, the flow rate for the $CF_4$ process gas is set to 85 sccm.

Step six (6) of the method of forming the shallow trench 310 is another stability step (St). In this case, the plasma etch environment is being changed from the environment used in etching the mono-crystalline silicon layer 302, the thermal silicon oxide 304 and the poly-crystalline silicon 306 as specified in step five (5) to the environment used in rounding off the bottom of the shallow trench 310 as specified in step seven (7). In this stability step, the completion of the step is based on a time of 10 seconds. There is no endpoint detection in this step. The RF power is set to zero (0) Watt. The pressure of the process gas is set to 80 mTorr. The magnetic field is set to 30 Gauss. The Helium backside pressure on the wafer is set to 4000 mTorr. The flow rate for the hydrogen bromide (HBr) process gas is set to 60 sccm. The flow rate for a chlorine ($CL_2$) process gas is set to 85 sccm. And, the flow rate for a mixture of Helium-Oxygen (He—O2) gas is set to 15 sccm.

Step seven (7) of the method of forming the shallow trench 310 is an etching step for rounding off the bottom of the shallow trench 310. In this stability step, the completion of the step is based on time, which is set to 15 seconds. There is no endpoint detection in this step. The RF power is set to 500 Watts. The pressure of the process gas is set to 80 mTorr. The magnetic field is set to 30 Gauss. The Helium backside pressure on the wafer is set to 4000 mTorr. The flow rate for the hydrogen bromide (HBr) process gas is set to 60 sccm. The flow rate for a nitrogen fluoride ($NF_3$) process gas is set to 3 sccm. And, the flow rate for a mixture of Helium-Oxygen (He—O2) gas is set to 15 sccm.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. In a plasma etching apparatus, a method of etching first and second materials having interfaces at non-perpendicular angles to the direction of an etch propagation, comprising:

subjecting said first and second materials to a plasma gas mixture comprising a first gas which dominates an etching of said first material, a second gas which dominates an etching of said second material, and a third gas which reduces the etching rate of said first material, wherein said plasma gas mixture etches said first and second materials at substantially the same rate.

2. The method of claim 1, wherein said interfaces are substantially parallel to the direction of said etch propagation.

3. The method of claim 1, wherein said first material comprises a mono- or poly-crystalline silicon and said first gas comprises hydrogen bromide.

4. The method of claim 1, wherein said first material comprises a mono- or poly-crystalline silicon and said first gas comprises chlorine.

5. The method of claim 1, wherein said first material comprises a mono- or poly-crystalline silicon and said third gas comprises tri-fluoro methane.

6. The method of claim 1, wherein said first material comprises a mono- or poly-crystalline silicon and said third gas comprises di-fluoro methane.

7. The method of claim 1, wherein said second material comprises an oxide or a nitride and said second gas comprises $CF_4$.

8. The method of claim 1, wherein said second material comprises an oxide or and a nitride a fourth gas comprises oxygen ($O_2$).

9. The method of claim 1, further including selecting secondary parameters of said plasma etching apparatus so that said first and second materials are etched at substantially the same rate.

10. The method of claim 1, wherein said first material comprises a mono- or poly-crystalline silicon, said first gas comprises hydrogen bromide or chlorine, and said third gas comprises tri-fluoro methane or di-fluoro methane; wherein said second material comprises an oxide or a nitride, said second gas comprises $CF_4$, and a fourth gas comprises oxygen to reduce an etching rate of said oxide or nitride materials; and further including selecting secondary parameters of said plasma etching apparatus so that said first and second materials are etched at substantially the same rate.

11. In a plasma etching apparatus, a method of etching first and second materials having interfaces at non-perpendicular angles to the direction of an etch propagation, comprising:

subjecting said first and second materials to a plasma gas mixture comprising a first gas which dominates an etching of said first material, and a second gas which dominates an etching of said second material, wherein said plasma gas mixture etches said first and second materials at substantially the same rate, wherein said first material comprises a mono- or poly-crystalline silicon and said first gas comprises chlorine ($CL_2$).

12. In a plasma etching apparatus, a method of etching first and second materials having interfaces at non-perpendicular angles to the direction of an etch propagation, comprising:

subjecting said first and second materials to a plasma gas mixture comprising a first gas which dominates an etching of said first material, and a second gas which dominates an etching of said second material, wherein said plasma gas mixture etches said first and second materials at substantially the same rate, wherein said first material comprises a mono- or poly-crystalline silicon and said third gas comprises di-fluoro methane ($CH_2F_2$).

13. In a plasma etching apparatus, a method of etching first and second materials having interfaces at non-perpendicular angles to the direction of an etch propagation, comprising:

subjecting said first and second materials to a plasma gas mixture comprising a first gas which dominates an etching of said first material, and a second gas which dominates an etching of said second material, wherein said plasma gas mixture etches said first and second materials at substantially the same rate, wherein said second material comprises an oxide or a nitride and said second gas comprises $CF_4$.

14. In a plasma etching apparatus, a method of etching first and second materials having interfaces at non-perpendicular angles to the direction of an etch propagation, comprising:

subjecting said first and second materials to a plasma gas mixture comprising a first gas which dominates an etching of said first material, and a second gas which dominates an etching of said second material, wherein said plasma gas mixture etches said first and second materials at substantially the same rate, wherein said first material comprises mono- or poly-crystalline silicon and said first gas comprises hydrogen bromide (HBr) or chlorine (CL2); wherein said second material comprises an oxide or a nitride and said second gas comprises $CF_4$, and further including selecting secondary parameters of said plasma etching apparatus so that said first and second materials are etched at substantially the same rate.

\* \* \* \* \*